(12) United States Patent
Sato et al.

(10) Patent No.: US 11,072,710 B2
(45) Date of Patent: Jul. 27, 2021

(54) SURFACE-TREATED SILICA FILLER, AND RESIN COMPOSITION CONTAINING SURFACE-TREATED SILICA FILLER

(71) Applicant: NAMICS Corporation, Niigata (JP)

(72) Inventors: Ayako Sato, Niigata (JP); Masashi Kajita, Niigata (JP)

(73) Assignee: NAMICS Corporation, Niigata (JP)

(*) Notice: Subject to any disclaimer, the term of this patent is extended or adjusted under 35 U.S.C. 154(b) by 25 days.

(21) Appl. No.: 16/474,586

(22) PCT Filed: Nov. 28, 2017

(86) PCT No.: PCT/JP2017/042541
§ 371 (c)(1),
(2) Date: Jun. 28, 2019

(87) PCT Pub. No.: WO2018/123395
PCT Pub. Date: Jul. 5, 2018

(65) Prior Publication Data
US 2019/0338138 A1  Nov. 7, 2019

(30) Foreign Application Priority Data

Dec. 28, 2016 (JP) .............................. JP2016-255430

(51) Int. Cl.
*C09J 7/30* (2018.01)
*C09C 1/30* (2006.01)
(Continued)

(52) U.S. Cl.
CPC ............ *C09C 1/309* (2013.01); *C01B 33/181* (2013.01); *C01B 33/186* (2013.01);
(Continued)

(58) Field of Classification Search
None
See application file for complete search history.

(56) References Cited

U.S. PATENT DOCUMENTS

| 2009/0076198 A1 | 3/2009 | Giesenberg et al. |
| 2013/0202543 A1* | 8/2013 | Kuper ..................... A61Q 5/00 424/70.1 |

(Continued)

FOREIGN PATENT DOCUMENTS

| CN | 105308123 A | 2/2016 |
| JP | 6-232296 A | 8/1994 |

(Continued)

OTHER PUBLICATIONS

4-Hyroxy-TEMPO, Chemicalbook, 2017, pp. 1-3. (Year: 2017).*

(Continued)

*Primary Examiner* — Peter A Salamon
(74) *Attorney, Agent, or Firm* — Troutman Pepper Hamilton Sanders LLP

(57) ABSTRACT

The present invention provides a surface-treated silica filler for suppressing an increase in viscosity when added to a resin composition used for applications such as a semiconductor sealing material, and the resin composition containing the surface-treated silica filler. The surface-treated silica filler of the present invention is surface-treated with a basic substance having an acid dissociation constant (pKa) of its conjugate acid of 9.4 or more.

17 Claims, 2 Drawing Sheets

(51) Int. Cl.
  *C01B 33/18* (2006.01)
  *C09J 11/04* (2006.01)
  *H01L 23/29* (2006.01)
(52) U.S. Cl.
  CPC .......... *C09C 1/3045* (2013.01); *C09C 1/3063* (2013.01); *C09C 1/3081* (2013.01); *C09J 7/30* (2018.01); *C09J 11/04* (2013.01); *H01L 23/295* (2013.01); *C01P 2004/32* (2013.01); *C09J 2203/326* (2013.01)

(56) References Cited

U.S. PATENT DOCUMENTS

| | | | |
|---|---|---|---|
| 2016/0130425 A1 | 5/2016 | Yoshitake et al. | |
| 2016/0312034 A1 | 10/2016 | Schneider et al. | |
| 2017/0145251 A1 | 5/2017 | Ogawa | |
| 2019/0338138 A1* | 11/2019 | Sato | C09J 7/30 |

FOREIGN PATENT DOCUMENTS

| | | |
|---|---|---|
| JP | 10-173103 A | 6/1998 |
| JP | 2004-161900 A | 6/2004 |
| JP | 2005-170771 A | 6/2005 |
| JP | 2005-171208 A | 6/2005 |
| JP | 2005-171209 A | 6/2005 |
| JP | 2008-81591 A | 4/2008 |
| JP | 2008-518067 A | 5/2008 |
| JP | 2009091448 A * | 4/2009 |
| JP | 2012-214340 A | 11/2012 |
| JP | 5220981 B2 | 6/2013 |
| JP | 2015-218229 A | 12/2015 |
| JP | 2016-124715 A | 7/2016 |
| WO | 2013/061478 A1 | 5/2013 |

OTHER PUBLICATIONS

International Search Report issued in corresponding International Patent Application No. PCT/JP2017/042541 dated Jan. 16, 2018.
Extended European Search Report issued in European Patent Application No. 17886464.1 dated Jul. 28, 2020.
First Office Action issued in Chinese Patent Application No. 201780080746.X dated Jul. 29, 2020, with translation.
"Organic Chemistry", Tian Chang-rong, p. 277, People's Medical Publishing House, Jul. 31, 2000 Cited in Chinese OA; without translation.

* cited by examiner

SURFACE-TREATED SILICA FILLER, AND RESIN COMPOSITION CONTAINING SURFACE-TREATED SILICA FILLER

CROSS REFERENCE TO RELATED APPLICATIONS

This is a U.S. National Phase Application under 35 U.S.C. § 371 of International Patent Application No. PCT/JP2017/042541, filed Nov. 28, 2017, which claims priority of Japanese Patent Application No. 2016-255430, filed Dec. 28, 2016. The entire contents of which are hereby incorporated by reference.

FIELD OF TECHNOLOGY

The present invention relates to a surface-treated silica filler blended in a resin composition used as a semiconductor sealing material, a one-component adhesive used when manufacturing an electronic component, and an adhesive film used as NCF (Non Conductive Film) when mounting a semiconductor, and the resin composition containing the surface-treated silica filler.

BACKGROUND

With miniaturization, weight reduction, and high performance of electronic devices, a mounting form of semiconductors is changing from a wire bond type to a flip chip type.

A flip chip type semiconductor device has a structure in which an electrode portion on a substrate and a semiconductor element are connected via a bump electrode. In the semiconductor device of this structure, when thermal load such as a temperature cycle is applied, stress is applied to the bump electrode due to a difference between thermal expansion coefficients of the substrate made of an organic material such as an epoxy resin and the semiconductor element, and there is a problem that defects such as cracks occur in the bump electrode. In order to suppress the defects from occurring, it is widely practiced to improve thermal cycle resistance by sealing a gap between the semiconductor element and the substrate using the semiconductor sealing material called an underfill and fixing the both to each other.

As a supply method of an underfill material, capillary flow is generally used. In this capillary flow, the semiconductor element and the electrode portion on the substrate are connected. Thereafter, the underfill material is applied (dispensed) along an outer periphery of the semiconductor element, and the underfill material is injected into the gap between the both using capillary action. By heating and curing the underfill material after injection of the underfill material, a connection portion between the both is reinforced.

The underfill material is required to be excellent in injectability, adhesiveness, curability, storage stability and the like. In addition, a portion sealed with the underfill material is required to be excellent in moisture resistance, thermal cycle resistance, and the like.

In order to satisfy the above-mentioned requirements, a material containing an epoxy resin as a main material is widely used as the underfill material.

It is known that controlling the difference between thermal expansion coefficients the substrate made of the organic material such as the epoxy resin and the semiconductor element by adding a filler made of an inorganic substance (hereinafter referred to as an "inorganic filler") to the underfill material, and reinforcing the bump electrode are effective to improve the moisture resistance and the thermal cycle resistance, particularly the thermal cycle resistance, of the portion sealed with the underfill material (See JP-A-10-173103).

As the inorganic filler to be added for this purpose, a silica filler is preferably used because of high electrical insulation and a low thermal expansion coefficient.

However, since the silica filler is easily aggregated in the semiconductor sealing material, the semiconductor sealing material is nonuniform and has a high viscosity, and as a result, there has been a problem that flowability is lowered, and formability cannot be further improved.

In order to solve the above problems, Japanese Patent No. 5220981 proposes treating a surface of the silica filler with a basic substance or a basic mixture. In Japanese Patent No. 5220981, the above-mentioned basic substance or basic mixture is one or more selected from ammonia, organic amine, silazanes, a cyclic compound containing nitrogen or a solution thereof, and an amine-based silane coupling agent or a solution thereof. Among them, it is considered that the above-mentioned basic substance or basic mixture is preferably silazanes, and particularly preferably hexamethyldisilazane (HMDS).

SUMMARY

Although reasons for treating the surface of the silica filler with the basic substance or the basic mixture are not specified in Japanese Patent No. 5220981, it is presumed to be the following reason.

Acidic silanol groups are present on the surface of the silica filler. Therefore, the following problems may occur when the silica filler is added to the semiconductor sealing material.

(1) The silanol group on the surface of the silica filler functions as an acid catalyst, and homopolymerization of the epoxy resin contained in the semiconductor sealing material proceeds, which may cause thickening and unintended curing of the semiconductor sealing material.

(2) Generally, in order to increase the filler content in the semiconductor sealing material, the silica filler may be surface-treated with a silane coupling agent and used. In this case, the filler itself acts as the acid catalyst to accelerate deterioration of the silane coupling agent, which may cause aggregation and handling deterioration of the filler. The silane coupling agent can also be used by being directly blended into the resin. Also in this case, hydrolysis of the silane coupling agent is promoted by the acidic silanol group present on the surface of the silica filler, and a large amount of alcohol is generated, which may cause problems such as thickening to be remarkable.

The silica filler is also added to the one-component adhesive used when manufacturing the electronic component, and the adhesive film used as NCF (Non Conductive Film) when mounting the semiconductor, in addition to the semiconductor sealing material. The above-mentioned problems (1) and (2) may occur also in these applications.

In Japanese Patent No. 5220981, it is presumed that the above-mentioned problems (1) and (2) are prevented by neutralizing the acidic silanol group present on the surface of the silica filler with the basic substance or the basic mixture.

Specifically, it is presumed that the above-mentioned problems (1) and (2) are prevented by chemisorbing the basic substance or the basic mixture onto the acidic silanol group present on the surface of the silica filler and neutralizing it.

However, it was found that a treatment method described in Japanese Patent No. 5220981 cannot necessarily exhibit operational effects of neutralization treatment.

In this regard, the present inventors have found that the operational effects of by the neutralization treatment are impaired during predrying performed before using the silica filler, as a result of intensive studies.

The silica filler may absorb moisture during storage, and when using the silica filler, there is a concern about adverse effects of the moisture. Therefore, pre-drying is often performed prior to use. In the case of the silica filler, the pre-drying is performed at a temperature of about 150° C. for about 4 hours.

It has been found that the basic substance or the basic mixture chemisorbed to the acidic silanol group present on the surface of the silica filler by neutralization treatment is desorbed during pre-drying, and thus the effects of the neutralization treatment may not be expressed. It has been confirmed that the basic substance or the basic mixture chemisorbed to the acidic silanol group present on the surface of the silica filler is desorbed during pre-drying based on a change in pH on the surface of the silica filler before and after heat treatment in Example described below.

In order to solve the above-mentioned problems in the related art, an object of the present invention is to provide the surface-treated silica filler for suppressing an increase in viscosity when added to the resin composition used for applications such as the semiconductor sealing material, and the resin composition containing the surface-treated silica filler.

In order to achieve the above object, the present invention provides a surface-treated silica filler, which is surface-treated with a basic substance having an acid dissociation constant (pKa) of its conjugate acid of 9.4 or more.

In the surface-treated silica filler of the present invention, the basic substance having the pKa of 9.4 or more is preferably at least one selected from the group including benzylamine, 2-methoxyethylamine, 3-amino-1-propanol, 3-aminopentane, 3-methoxypropylamine, cyclohexylamine, n-butylamine, dimethylamine, diisopropylamine, piperidine, pyrrolidine, and 1,8-diazabicyclo [5.4.0]-7-undecene (DBU).

In the surface-treated silica filler of the present invention, the silica filler is preferably at least one selected from the group including spherical silica powders obtained by reacting metal silicon with oxygen, spherical silica powders obtained by melting pulverized silica, and the pulverized silica.

In the surface-treated silica filler of the present invention, the silica filler is preferably obtained by at least one method selected from the group including sol-gel method, precipitation method, and aqueous solution wet method.

The surface-treated silica filler of the present invention is preferably surface-treated with the basic substance having the pKa of 9.4 or more, and then further surface-treated with a silane coupling agent.

In the surface-treated silica filler of the present invention, the silane coupling agent is preferably at least one selected from the group including an epoxy silane coupling agent, an amine-based silane coupling agent, a vinyl silane coupling agent, and an acrylic silane coupling agent.

The present invention provides a resin composition including the surface-treated silica filler of the present invention.

The present invention provides a semiconductor sealing material including the resin composition of the present invention.

The present invention provides a one-component adhesive including the resin composition of the present invention.

The present invention provides an adhesive film produced using the resin composition of the present invention.

The surface-treated silica filler of the present invention is surface-treated with the basic substance to neutralize acidic silanol groups present on the surface of the silica filler. In surface treatment of the silica filler, since the basic substance having the pKa of 9.4 or more is used, desorption of the basic substance chemisorbed to the acidic silanol group present on the surface of the silica filler is suppressed during pre-drying of the silica filler.

Therefore, the pre-drying of the silica filler does not impair operational effects of the neutralization treatment. As a result, it is possible to suppress the increase in viscosity when added to the resin composition used for applications such as the semiconductor sealing material. In addition, it is possible to suppress deterioration of a treated layer when the silica filler is surface-treated with the silane coupling agent.

DETAILED DESCRIPTION

Figure 1:
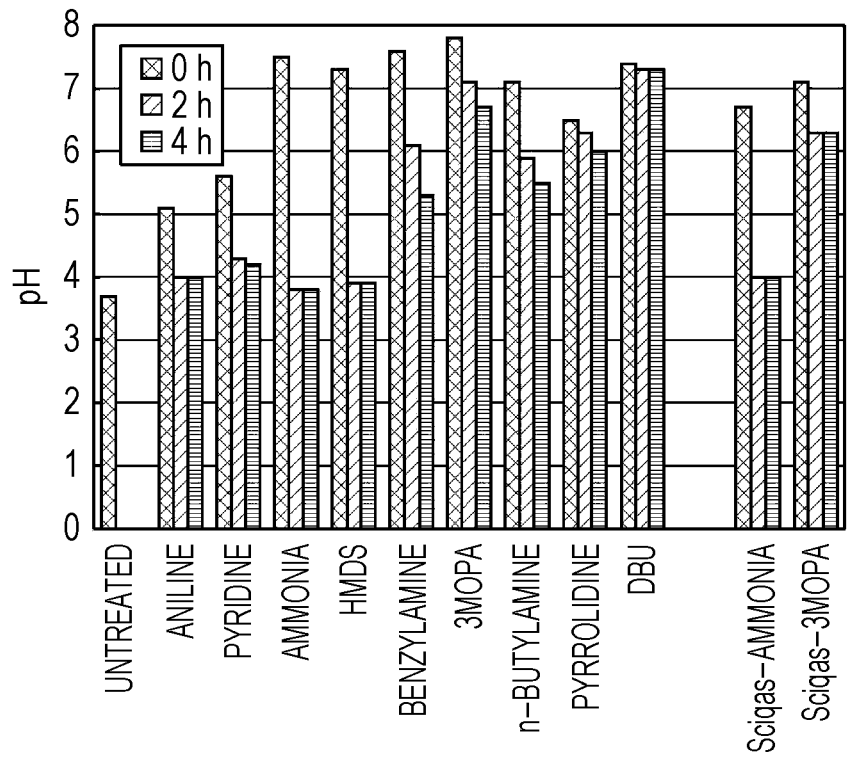
FIG. 1 is a graph showing a relationship between heat treatment time and pH at 150° C. heat treatment for silica fillers surface-treated with different basic substances.

The present invention will be described in detail below.
<Surface-Treated Silica Filler>

A surface-treated silica filler of the present invention is surface-treated with a basic substance having an acid dissociation constant (pKa) of its conjugate acid of 9.4 or more.

Note that the silica filler to be surface-treated is not specifically limited. Surface treatment can be widely applied to the silica fillers added for the purpose of lowering coefficient of thermal expansion to the resin composition used for applications such as a semiconductor sealing material, a one-component adhesive used when manufacturing an electronic component, and an adhesive film used as NCF when mounting a semiconductor. The silica filler to be surface-treated will be described in detail below.

The surface-treated silica filler of the present invention is surface-treated with the basic substance in order to neutralize acidic silanol groups present on a surface of the silica filler with the basic substance. When it is surface-treated with the basic substance, the basic substance is chemisorbed to the acidic silanol group present on the surface of the silica filler to neutralize the silanol group.

In the surface-treated silica filler of the present invention, the basic substance having the acid dissociation constant (pKa) of its conjugate acid of 9.4 or more is used as the basic substance.

The present inventors conducted intensive studies on ease of desorption of the basic substance chemisorbed to the silanol groups during heating such as pre-drying of the silica filler, and as a result, found that the pKa of the basic substance affects the ease of desorption. That is, it was found that the basic substance having a smaller pKa is more easily desorbed from the silanol group during heating, and the basic substance having a larger pKa is more difficult to be desorbed from the silanol group during heating.

Further, it was found that in the case of pre-drying conditions of the silica filler mentioned above, if the basic substance has the pKa of 9.4 or more, the desorption from the silanol group is suppressed.

The basic substances having the pKa of 9.4 or more include, for example, benzylamine, 2-methoxyethylamine, 3-amino-1-propanol, 3-aminopentane, 3-methoxypropylamine, cyclohexylamine, n-butylamine, dimethylamine, diisopropylamine, piperidine, pyrrolidine, and 1,8-diazabicyclo [5.4.0]-7-undecene (DBU). The basic substances may be used alone or in combination of two or more.

Among them, 3-methoxypropylamine, n-butylamine and pyrrolidine are preferred because they are liquid at normal temperature and have appropriate volatility, and 3-methoxypropylamine and n-butylamine are more preferred.

A method of surface treatment with the basic substance is appropriately selected depending on the basic substance to be used. The basic substances exemplified above are all liquids or gases at normal temperature. Therefore, while the basic substance and the silica filler are present in the same atmosphere, by heating the atmosphere and vaporizing the basic substance, the basic substance is brought into contact with the surface of the silica filler in gas phase, so that the silica filler can be surface-treated. Therefore, these basic substances are preferred.

When the basic substance is brought into contact with the surface of the silica filler in the gas phase according to the above procedure, it is possible to remove the basic substance which has not been chemisorbed to the silanol groups present on the surface of the silica filler by further heating the above atmosphere, specifically, by heating up to the pre-drying conditions of the silica filler described above. By heating, it is possible to remove a basic substance which has not been chemically adsorbed to silanol groups present on the surface of the silica filler.

However, the above-described procedure is an example of a surface treatment procedure with the basic substance. The surface treatment procedure with the basic substance is not limited to this, but can be appropriately selected depending on the basic substance to be used. For example, when using the basic substance having a large molecular weight and difficult to vaporize, such as DBU, the surface of the silica filler may be surface-treated by immersing the silica filler in a solution containing the basic substance. Or, the surface of the silica filler may be surface-treated by spraying the solution containing the basic substance onto the silica filler.

The surface-treated silica filler of the present invention is preferably surface-treated with the basic substance and then further surface-treated with a silane coupling agent. Since the basic substance having the pKa of 9.4 or more is chemisorbed to the acidic silanol groups present on the surface of the silica filler, when the silica filler surface-treated with the silane coupling agent is heated, the desorption of the basic substance from the silanol group is suppressed. Therefore, there is not a possibility that effects of the surface treatment are impaired, by the silanol group on the surface of the silica filler serving as a catalyst to excessively promote hydrolysis of alkoxide of the silane coupling agent and cleavage of epoxy group contained in an epoxy silane coupling agent.

The silane coupling agent used for the surface treatment is not particularly limited. As the silane coupling agent, at least one selected from the group including an epoxy silane coupling agent, an amine-based silane coupling agent, a vinyl silane coupling agent, and an acrylic silane coupling agent can be used.

Among them, the epoxy silane coupling agent is preferred because of affinity with an epoxy resin which is a main material of a semiconductor resin composition when the silica filler is added to the semiconductor resin composition and used.

The silane coupling agents may be used alone or in combination of two or more.

The method of surface treatment with the silane coupling agent is not particularly limited, and can be performed by, for example, a stirring method, a wet method, a dry method or the like.

The stirring method is a method in which the silane coupling agent and the silica filler are charged in advance in a stirring device and stirred under appropriate conditions. A mixer such as a Henschel mixer, which can stir and mix this at high-speed rotation, can be used as the stirring device. However, the stirring device is not particularly limited.

In the wet method, a surface treatment solution is obtained by dissolving a sufficient amount of silane coupling agent with respect to a surface area of the silica filler to be surface-treated in water or an organic solvent. The silica filler is added to the obtained surface treatment solution, and this is stirred to be in the form of a slurry. After the silane coupling agent and the silica filler are sufficiently reacted by stirring, the silica filler is separated from the surface treatment solution by a method such as filtration or centrifugation, and dried by heating.

In the dry method, stock solution or solution of the silane coupling agent is uniformly dispersed and treated in the silica filler being stirred at high speed by the stirring device. The mixer such as the Henschel mixer, which can stir and mix this at high-speed rotation, can be used as the stirring device. However, the stirring device is not particularly limited.

Note that, for example, an integral blend method can also be suitably used in addition to the stirring method, the wet method, and the dry method. In the integral blend method, the silane coupling agent is directly added to a silica filler dispersion obtained by dispersing the silica filler in a resin or a solvent to modify the surface of the silica filler.

The surface-treated silica filler of the present invention will be further described below.

(Silica Filler)

The silica filler to be surface-treated is not limited by a method for producing the same. For example, the silica filler includes spherical silica powders obtained by reacting metal silicon with oxygen, spherical silica powders obtained by melting pulverized silica, and the pulverized silica.

In addition, the silica fillers obtained by sol-gel method, precipitation method, or aqueous solution wet method are exemplified.

The silica fillers may be used alone or in combination of two or more.

A shape of the silica filler to be surface-treated is not particularly limited, but may be any form of granular, powdery, and scale-like forms. In the case where the shape of the silica filler is other than granular, an average particle diameter of the silica filler means an average maximum diameter of the silica filler.

However, a substantially spherical shape having a sphericity of 0.8 or more is preferred from the viewpoint of improving dispersibility of the silica filler in a liquid sealing material and injectability of the liquid sealing material, and bringing it to a close-packed state. The "sphericity" used herein is defined as a "ratio of the smallest diameter to the largest diameter of particles". For example, as a result of observation with a scanning electron microscope (SEM), the ratio of the smallest diameter to the largest diameter to be observed may be 0.8 or more. The silica filler preferably has a sphericity of 0.9 or more.

A size of the silica filler to be surface-treated is not particularly limited, but can be appropriately selected depending on applications of the surface-treated silica filler as described below.

When the surface-treated silica filler is added to the resin composition and used as the semiconductor sealing material, from the viewpoint of viscosity adjustment of the semiconductor sealing material, injection of the semiconductor sealing material, prevention of generation of voids, and the like, the average particle diameter of the silica filler is preferably 0.05 to 80 µm, more preferably 0.1 to 15 µm, and still more preferably 0.1 to 3 µm.

Further, in addition to the average particle diameter being in the above range, it is more preferable to use the silica filler having a very uniform particle size distribution. Specifically, it is more preferable to use the silica filler having a particle size distribution of the average particle diameter±0.2 µm is 90% or more of the whole.

When the surface-treated silica filler is added to the resin composition and used as the one-component adhesive used when manufacturing the electronic component, the average particle diameter of the silica filler is 0.007 to 10 µm, and preferably 0.1 to 6 µm.

When the surface-treated silica filler is added to the resin composition, and the adhesive film prepared using the resin composition is used as NCF, the average particle diameter of the silica filler is preferably 0.01 to 1 µm, and more preferably 0.05 to 0.3 µm because of permeation to narrow gaps and transparency.

<Resin Composition>

Since the resin composition of the present invention is used as the semiconductor sealing material, the one-component adhesive used when manufacturing the electronic component, and the adhesive film used as NCF (Non Conductive Film) when mounting the semiconductor, it contains the surface-treated silica filler described above as an essential component.

Since the resin composition of the present invention is used as the semiconductor sealing material, the one-component adhesive used when manufacturing the electronic component, and the adhesive film used as NCF when mounting the semiconductor, it preferably contains a thermosetting resin.

The thermosetting resin contained in the resin composition of the present invention is not particularly limited. The thermosetting resin is preferably liquid at room temperature (25° C.). The thermosetting resin includes the epoxy resin, a (meth)acrylic resin, and a maleimide resin.

The epoxy resin is a compound having one or more epoxy groups in its molecule. The epoxy resin can form a three-dimensional network structure by reaction of the epoxy group by heating and can be cured. It is preferred that two or more epoxy groups are contained in one molecule from the viewpoint of cured product properties.

The epoxy resin includes the following bifunctional epoxy resin, trifunctional epoxy resin, and multifunctional epoxy resin. However, the epoxy resin is not limited thereto. The bifunctional epoxy resin is a resin obtained by epoxidizing bisphenol compound such as bisphenol A, bisphenol E, and bisphenol F, or derivatives thereof (for example, alkylene oxide adduct), diol having an alicyclic structure such as hydrogenated bisphenol A, hydrogenated bisphenol E, hydrogenated bisphenol F, cyclohexanediol, cyclohexanedimethanol, and cyclohexanediethanol, or derivatives thereof, or aliphatic diol such as butanediol, hexanediol, octanediol, nonanediol, and decanediol, or derivatives thereof. The trifunctional epoxy resin has a trihydroxyphenylmethane skeleton or an aminophenol skeleton. The polyfunctional epoxy resin is a resin obtained by epoxidizing phenol novolak resin, cresol novolak resin, phenol aralkyl resin, biphenyl aralkyl resin, naphthol aralkyl resin or the like.

The epoxy resin is preferably liquid at room temperature (25° C.) and can be made to be liquid at room temperature, either alone or as a mixture. The epoxy resin can also be made to be liquid using a reactive diluent. Examples of the reactive diluent include monofunctional aromatic glycidyl ethers such as phenyl glycidyl ether and cresyl glycidyl ether, aliphatic glycidyl ethers, and the like.

As the thermosetting resin, the (meth)acrylic resin can be used. The (meth)acrylic resin can be a compound having a (meth)acryloyl group in its molecule. The (meth) acrylic resin can form the three-dimensional network structure by reaction of the (meth)acryloyl group and can be cured. The (meth)acrylic resin includes methyl (meth)acrylate, ethyl (meth)acrylate, n-butyl (meth)acrylate, isobutyl (meth)acrylate, tertiary butyl (meth)acrylate, isodecyl (meth)acrylate, lauryl (meth)acrylate, tridecyl (meth)acrylate, cetyl (meth) acrylate, stearyl (meth)acrylate, isoamyl (meth)acrylate, isostearyl (meth)acrylate, behenyl (meth)acrylate, 2-ethylhexyl (meth)acrylate, other alkyl (meth)acrylates, cyclohexyl (meth)acrylate, tertiary butyl cyclohexyl (meth)acrylate, tetrahydrofurfuryl (meth)acrylate, benzyl (meth) acrylate, phenoxyethyl (meth)acrylate, isobornyl (meth) acrylate, glycidyl (meth)acrylate, trimethylolpropane tri (meth)acrylate, zinc mono(meth)acrylate, zinc di(meth) acrylate, dimethylaminoethyl (meth)acrylate, diethylaminoethyl (meth)acrylate, neopentyl glycol (meth) acrylate, trifluoroethyl (meth)acrylate, 2,2,3,3-tetrafluoropropyl (meth)acrylate, 2,2,3,3,4,4-hexafluorobutyl (meth) acrylate, perfluorooctyl (meth)acrylate, perfluorooctylethyl (meth)acrylate, ethylene glycol di(meth)acrylate, propylene glycol di(meth)acrylate, 1,4-butanediol di(meth)acrylate, 1,6-hexane diol di(meth)acrylate, 1,9-nonanediol di(meth) acrylate, 1,3-butanediol di(meth)acrylate, 1,10-decanediol di(meth)acrylate, tetramethylene glycol di(meth)acrylate, methoxyethyl (meth)acrylate, butoxyethyl (meth)acrylate, ethoxydiethylene glycol (meth)acrylate, methoxypolyalkylene glycol mono(meth)acrylate, octoxy polyalkylene glycol mono(meth)acrylate, lauroxy polyalkylene glycol mono(meth)acrylate, stearoxy polyalkylene glycol mono (meth)acrylate, aryloxy polyalkylene glycol mono(meth) acrylate, nonyl phenoxy polyalkylene glycol mono(meth) acrylate, di(meth)acryloyloxymethyltricyclodecane, N-(meth)acryloyloxyethyl maleimide, N-(meth)acryloyloxyethyl hexahydrophthalimide, and N-(meth)acryloyloxyethyl phthalimide. N, N'-methylenebis(meth)acrylamide, N, N'-ethylenebis(meth)acrylamide, and (meth)acrylamide of 1,2-di(meth)acrylamidoethylene glycol can also be used. Vinyl compounds such as N-vinyl-2-pyrrolidone, styrene derivatives and α-methylstyrene derivatives can also be used.

As the (meth)acrylic resin, poly (meth)acrylate can be used. The poly (meth)acrylate is preferably a copolymer of (meth)acrylic acid and (meth)acrylate, or a copolymer of (meth)acrylate having a hydroxyl group and a (meth)acrylate having no polar group, or the like.

As the (meth)acrylic resin, for example, the following (meth)acrylates having a hydroxyl group, and (meth)acrylates having a carboxy group obtained by reacting the (meth)acrylates having the hydroxyl group with dicarboxylic acids or their derivatives can also be used. The (meth)acrylates having the hydroxyl group includes 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, 1,2-cyclohexanediol mono(meth)acrylate, 1,3-cyclohexanediol mono(meth)acrylate, 1,4-cyclohexanediol mono(meth)acrylate, 1,2-cyclohexanedimethanol mono (meth)acrylate, 1,3-cyclohexanedimethanol mono(meth) acrylate, 1,4-cyclohexanedimethanol mono(meth)acrylate, 1,2-cyclohexanediethanol mono(meth)acrylate, 1,3-cyclohexanediethanol mono(meth)acrylate, 1,4-cyclohexanediethanol mono(meth)acrylate, glycerin mono(meth)acrylate, glycerin di(meth)acrylate, trimethylolpropane mono(meta)acrylate, trimethylolpropane di(meth)acrylate, pentaerythritol mono(meth)acrylate, pentaerythritol di(meth)acrylate, pentaerythritol tri(meth)acrylate, neopentyl glycol mono (meth)acrylate, and the like. Further, usable dicarboxylic acids include, for example, oxalic acid, malonic acid, succinic acid, glutaric acid, adipic acid, pimelic acid, suberic acid, azelaic acid, sebacic acid, maleic acid, fumaric acid, phthalic acid, tetrahydrophthalic acid, hexahydrophthalic acid, and derivatives thereof.

The maleimide resin can be used as the thermosetting resin. The maleimide resin is a compound having one or more maleimide groups in one molecule. The maleimide resin can form the three-dimensional network structure by reaction of the maleimide group by heating and can be cured. Bismaleimide resins include, for example, N, N'-(4, 4'-diphenylmethane) bismaleimide, bis(3-ethyl-5-methyl-4-maleimidophenyl) methane, and 2,2-bis[4-(4-maleimidophenoxy) phenyl] propane. The maleimide resin is more preferably a compound obtained by reaction of dimer acid diamine with maleic anhydride, and a compound obtained by reaction of maleimidated amino acid such as maleimide acetic acid, and maleimide caproic acid with polyol. The maleimidated amino acid is obtained by reacting maleic anhydride with amino acetic acid or aminocaproic acid. The polyol is preferably polyether polyol, polyester polyol, polycarbonate polyol, and poly(meth)acrylate polyol, and is particularly preferably polyol containing no aromatic ring. Since the maleimide group can react with an allyl group, it is also preferred to be used in combination with an allyl ester resin. The allyl ester resin is preferably an aliphatic resin, and particularly preferred is a compound obtained by transesterification of cyclohexane diallyl ester and aliphatic polyol.

The resin composition of the present invention may contain the following components as optional components.
(Curing Agent)

The resin composition of the present invention may contain a curing agent for the thermosetting resin. Examples of the curing agent for the thermosetting resin include aliphatic amines, aromatic amines, dicyandiamides, dihydrazide compounds, acid anhydrides, and phenol resins. The curing agent for the thermosetting resin can be suitably used when using the epoxy resin as the thermosetting resin.

Aliphatic amines include aliphatic polyamines such as diethylenetriamine, triethylenetetramine, tetraethylenepentamine, trimethylhexamethylenediamine, m-xylenediamine, and 2-methylpentamethylenediamine, alicyclic polyamines such as isophoronediamine, 1,3-bisaminomethylcyclohexane, bis(4-aminocyclohexyl) methane, norbornene diamine, and 1,2-diaminocyclohexane, and piperazine type polyamines such as N-aminoethyl piperazine, and 1,4-bis (2-amino-2-methylpropyl) piperazine. Aromatic amines include, for example, aromatic polyamines such as diaminodiphenylmethane, m-phenylenediamine, diaminodiphenylsulfone, diethyltoluenediamine, trimethylene bis(4-aminobenzoate), and polytetramethylene oxide-di-p-aminobenzoate.

Dihydrazide compounds include, for example, carboxylic acid dihydrazides such as adipic acid dihydrazide, dodecanoic acid dihydrazide, isophthalic acid dihydrazide, and p-hydroxybenzoic acid dihydrazide. Acid anhydrides include, for example, phthalic anhydride, tetrahydrophthalic anhydride, hexahydrophthalic anhydride, endomethylenetetrahydrophthalic anhydride, dodecenyl succinic anhydride, a reaction product of maleic anhydride and polybutadiene, and a copolymer of maleic anhydride and styrene. As the phenol resin, a compound having two or more phenolic hydroxyl groups in one molecule can be used from the point of cured product properties. The number of phenolic hydroxyl groups is preferably 2 to 5. If a range of the phenolic hydroxyl group is within this range, the viscosity of the resin composition can be controlled to an appropriate range. The number of phenolic hydroxyl groups in one molecule is more preferably 2 or 3. Such compounds include bisphenols such as bisphenol F, bisphenol A, bisphenol S, tetramethyl bisphenol A, tetramethyl bisphenol F, tetramethyl bisphenol S, dihydroxy diphenyl ether, dihydroxy benzophenone, tetramethyl biphenol, ethylidene bisphenol, methyl ethylidene bis(m-ethyl phenol), cyclohexylidene bisphenol, and biphenol, and derivatives thereof, trifunctional phenols such as tri(hydroxyphenyl) methane and tri(hydroxyphenyl) ethane, and derivatives thereof, and a compound obtained by reacting phenols such as phenol novolak and cresol novolac with formaldehyde and mainly having binuclear or trinuclear body, and derivatives thereof.

A polymerization initiator such as a thermal radical polymerization initiator can be used as the curing agent for the thermosetting resin. The polymerization initiator can be suitably used when using the (meth)acrylic resin as the thermosetting resin. A well-known polymerization initiator can be used as the polymerization initiator. Specific examples of thermal radical polymerization initiators include methyl ethyl ketone peroxide, methyl cyclohexanone peroxide, methyl acetoacetate peroxide, acetylacetone peroxide, 1,1-bis(t-butylperoxy) 3,3,5-trimethylcyclohexane, 1,1-bis(t-hexylperoxy) cyclohexane, 1,1-bis(t-hexylperoxy) 3,3,5-trimethylcyclohexane, 1,1-bis(t-butylperoxy) cyclohexane, 2,2-bis(4,4-di-t-butylperoxycyclohexyl) propane, 1,1-bis(t-butylperoxy) cyclododecane, n-butyl 4,4-bis(t-butylperoxy) valerate, 2,2-bis(t-butylperoxy) butane, 1,1-bis(t-butylperoxy)-2-methylcyclohexane, t-butyl hydroperoxide, P-menthane hydroperoxide, 1,1,3,3-tetramethylbutyl hydroperoxide, t-hexyl hydroperoxide, dicumyl peroxide, 2,5-dimethyl-2,5-bis(t-butylperoxy) hexane, α,α'-bis(t-butylperoxy) diisopropylbenzene, t-butylcumyl peroxide, di-t-butyl peroxide, 2,5-dimethyl-2,5-bis(t-butylperoxy) hexyne-3, isobutyryl peroxide, 3,5,5-trimethylhexanoyl peroxide, octanoyl peroxide, lauroyl peroxide, cinnamic acid peroxide, m-toluoyl peroxide, benzoyl peroxide, diisopropyl peroxydicarbonate, bis(4-t-butylcyclohexyl) peroxydicarbonate, di-3-methoxybutylperoxydicarbonate, di-2-ethylhexylperoxydicarbonate, di-sec-butylperoxydicarbonate, di(3-methyl-3-methoxybutyl) peroxydicarbonate, di(4-t-butylcyclohexyl) peroxydicarbonate, α,α'-bis(neodecanoylperoxy) diisopropylbenzene, cumylperoxyneodecanoate, 1,1,3,3- tetramethylbutylperoxyneodecanoate, 1-cyclohexyl-1-methylethylperoxyneodecanoate, t-hexyl peroxyneodecanoate, t-butyl peroxyneodecanoate, t-hexyl peroxypivalate, t-butylperoxypivalate, 2,5-dimethyl-2,5-bis(2-ethylhexanoylperoxy) hexane, 1,1,3,3-tetramethylbutylperoxy-2-ethylhexanoate, 1-cyclohexyl-1-methylethylperoxy-2-ethylhexanoate, t-hexylperoxy-2-ethylhexanoate, t-butylperoxy-2-ethylhexanoate, t-butylperoxy isobutyrate, t-butylperoxymaleic acid, t-butylperoxy laurate, t-butylperoxy-3,5,5-trimethylhexanoate, t-butylperoxyisopropyl monocarbonate, t-butylperoxy-2-ethylhexyl monocarbonate, 2,5-dimethyl-2,5-bis(benzoylperoxy) hexane, t-butylperoxyacetate, t-hexylperoxybenzoate, t-butylperoxy-m-toluoylbenzoate, t-butylperoxybenzoate, bis(t-butylperoxy) isophthalate, t-butylperoxyallyl monocarbonate, 3,3',4,4'-tetra (t-butylperoxycarbonyl) benzophenone and the like. They may be used alone or in combination of two or more.

(Curing Accelerator)

The resin composition of the present invention may contain a curing accelerator for the thermosetting resin. When the epoxy resin is used as the thermosetting resin, examples of the curing accelerator include imidazoles, salts of triphenylphosphine or tetraphenylphosphine, and the like. Among them, imidazole compounds are preferred such as 2-methylimidazole, 2-ethylimidazole, 2-phenylimidazole, 2-phenyl-4-methylimidazole, 2-phenyl-4-methyl-5-hydroxymethylimidazole, 2-phenyl-4,5-dihydroxymethylimidazole, 2-$C_{11}H_{23}$-imidazole, and adducts of 2-methylimidazole with 2,4-diamino-6-vinyltriazine. Modified imidazole compounds can also be used. Epoxy-imidazole adduct-based compounds and acrylate-imidazole adduct compounds can also be used. Commercially available epoxy-imidazole adduct-based compounds include, for example, "Amicure PN-23" produced by Ajinomoto Fine-Techno Co., Inc., "Amicure PN-40" produced by Ajinomoto Fine-Techno Co., Inc., "Novacure HX-3721" produced by Asahi Kasei Corporation, and "Fujicure FX-1000" produced by Fuji Kasei Co., Ltd., and the like. Commercially available acrylate-imidazole adduct compounds include, for example, "EH2021" produced by ADEKA Corporation, and the like. "Novacure HX-3088" produced by Asahi Kasei Corporation can also be used.

The resin composition of the present invention may further contain components other than the above as required.

As specific examples of such components, silane coupling agent, metal complex, leveling agent, coloring agent, ion trap agent, antifoaming agent, antioxidant, flame retardant, coloring agent, stabilizer such as boric acid compound, or the like can be blended therein. When the resin composition of the present invention is used as the adhesive film, in addition to the above, a surface conditioner, a rheology regulator, a plasticizer, a dispersant, an antisettling agent, an elastomer component, or the like can be blended therein. The type and amount of each compounding agent are as usual.

The resin composition of the present invention can be produced by a usual method. Specifically, the components described above are mixed and stirred to prepare the resin composition. Mixing and stirring can be performed using a kneader, a Henschel mixer, a roll mill, a ball mill and the like. The method of mixing and stirring is, of course, not limited thereto. All components may be mixed simultaneously. Or, appropriate modifications may be made, such as some components being mixed first and the remaining components being mixed later.

When the resin composition of the present invention is used as the adhesive film, the resin composition prepared by the above procedure is diluted with the solvent to form a varnish, which is applied to at least one surface of a support and dried, and then the adhesive film with a supporting body or the adhesive film peeled off from the support can be provided.

The silica filler surface-treated by the above-described procedure is added to the resin composition of the present invention. Thus, the resin composition of the present invention can prevent problems such as fall of PCT tolerance when used as the semiconductor sealing material, the one-component adhesive, or the adhesive film.

EXAMPLES

Hereinafter, the present invention will be described in detail by way of Examples. However, the present invention is not limited thereto.

The surface treatment with the basic substance was performed in the following procedure.

The basic substance (3.6 mmol) was added to the silica filler (trade name Admafine SO-E2 (Admatechs Co., Ltd., average particle diameter: 0.5 μm); 2000 g), and heated (at a temperature roughly from a boiling point of the basic substance to 20° C. lower than the boiling point) in a container with a lid.

However, when the basic substance is ammonia, ammonia water (2.0 mL) was added to the silica filler (2000 g), the lid is closed and the mixture was heated for 1 hour. Then, the lid was opened and the mixture was further heated to remove water and excess ammonia, to adjust pH to a desired value.

When the basic substance is DBU, the silica filler (2000 g) is dispersed in isopropanol, and DBU (3.6 mmol) is added therein, and then the mixture was centrifuged, to remove supernatant and to dry precipitate, to obtain a sample.

Further, when the silica filler is a trade name Sciqas (Sakai Chemical Industry Co., Ltd., average particle diameter: 0.1 μm), an amount of the basic substance to be added to 2000 g of the silica filler was 10.0 mmol.

The treated silica filler was placed in a separate non-sealed container and heated in a drying machine at 150° C. for a specified time. Then, pH of a suspension water in which the silica filler is suspended in water was measured.

The pH was measured after two-point calibration using a LAQUA Twin compact pH meter (Horiba, Ltd.). In a flat sensor unit, the silica filler sample and pure water were suspended directly, and the values were read when stabilized. This was repeated three times, and the average value was adopted as data.

Results are shown in the following Table 1 and FIG. 1.

TABLE 1

| Silica filler | Basic substance | pH 150° C. Heating | | | Boiling point of basic substance (° C., 1 atm) | pKa[(1)] of basic substance |
|---|---|---|---|---|---|---|
| | | 0 h | 2 h | 4 h | | |
| SO-E2 | Untreated | 3.7 | — | — | — | — |
| SO-E2 | Aniline | 5.1 | 4.0 | 4.0 | 184 | 4.63 |

TABLE 1-continued

| Silica filler | Basic substance | pH 150° C. Heating | | | Boiling point of basic substance (° C., 1 atm) | pKa[1] of basic substance |
|---|---|---|---|---|---|---|
| | | 0 h | 2 h | 4 h | | |
| SO-E2 | Pyridine | 5.6 | 4.3 | 4.2 | 115 | 5.67 |
| SO-E2 | Ammonia | 7.5 | 3.8 | 3.8 | −33 | 9.36 |
| SO-E2 | HMDS | 7.3 | 3.9 | 3.9 | 125 ($NH_3$: −33) | 7.55 ($NH_3$: 9.36) |
| SO-E2 | Benzylamine | 7.6 | 6.1 | 5.3 | 184 | 9.43 |
| SO-E2 | 3MOPA | 7.8 | 7.1 | 6.7 | 120 | 10.49 |
| SO-E2 | n-butylamine | 7.1 | 5.9 | 5.5 | 77 | 10.77 |
| SO-E2 | Pyrrolidine | 6.5 | 6.3 | 6.0 | 88 | 11.4 |
| SO-E2 | DBU | 7.4 | 7.3 | 7.3 | 261 | 12.5[2] |
| Sciqas | Ammonia | 6.7 | 4.0 | 4.0 | −33 | 9.36 |
| Sciqas | 3MOPA | 7.1 | 6.3 | 6.3 | 120 | 10.49 |

[1]values in water, from the 5th edition of Chemical Handbook Basic Edition
[2]from San-Apro Ltd. website Symbols in Tables and FIG. 1 mean the followings.
HMDS: 1,1,1,3,3,3-hexamethyldisilazane
3MOPA: 3-methoxypropylamine
DBU: 1,8-diazabicyclo [5.4.0]-7-undecene The pH of the silica filler was higher in the sample surface-treated with the basic substance than that of an untreated sample. However, in the surface-treated sample with aniline or pyridine having the pKa much lower than 9.4, the pH of the silica filler was low even immediately after the surface treatment, and effects of neutralization treatment were insufficient. In the sample surface-treated with ammonia or HMDS having the pKa of less than 9.4, the pH of the silica filler immediately after the surface treatment was 7 or more, and the effects of the neutralization treatment was confirmed. However, the pH of the silica filler after heat treatment at 150° C. for 2 hours to 4 hours was significantly reduced, and it was confirmed that the heat treatment caused the basic substance to be desorbed from the silanol group.

On the other hand, in the samples surface-treated with benzylamine, 3MOPA, n-butylamine, pyrrolidine, or DBU having the pKa of 9.4 or more, it was confirmed that a decrease in pH of the silica filler was small even after the heat treatment at 150° C. for 2 hours to 4 hours, and the desorption of the basic substance from the silanol group was suppressed during the heat treatment. In the sample surface-treated with pyrrolidine, the pH of the silica filler immediately after the surface treatment is slightly lower than 7. However, the effects of neutralization treatment are sufficient.

For the sample using Sciqas as the silica filler, it was surface-treated with ammonia having the pKa of less than 9.4 or 3MOPA having the pKa of 9.4 or more as the basic substance. The same relationship as above was confirmed.

Figure 2:
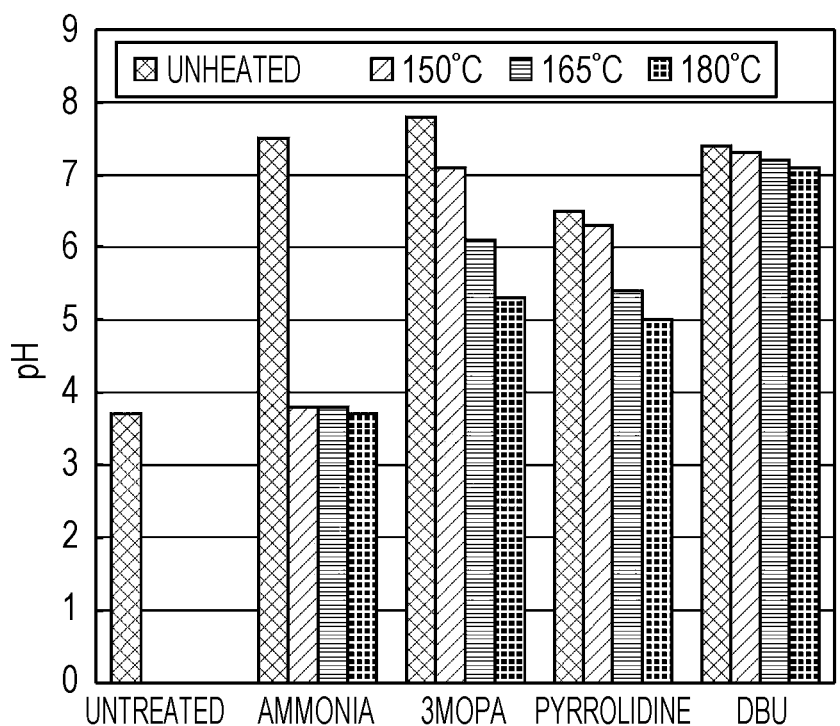
FIG. 2 is a graph showing a relationship between heat treatment temperature and pH for the silica fillers surface-treated with different basic substances.
Figure 3:
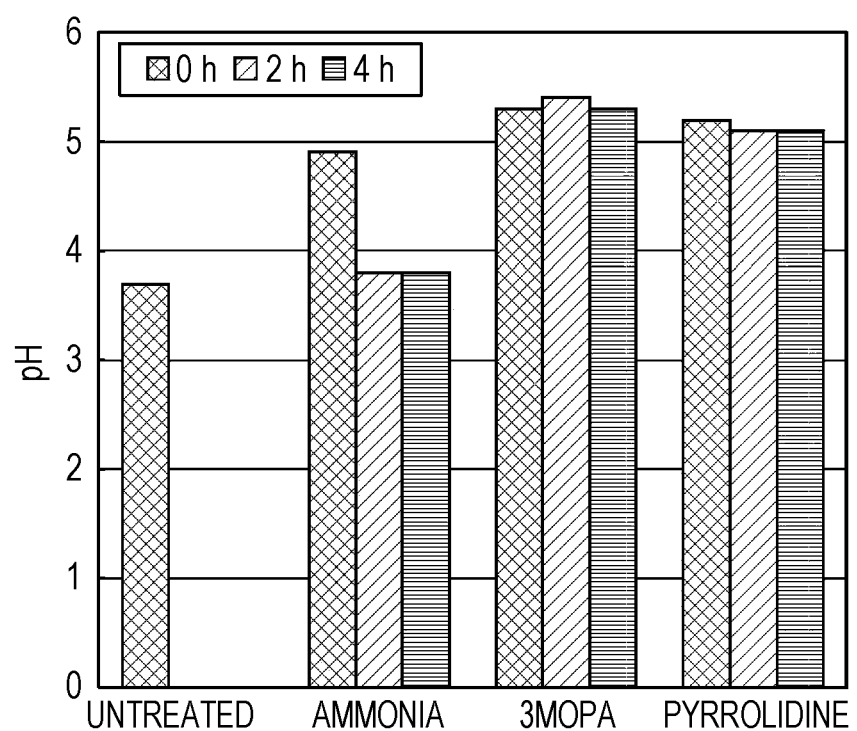
FIG. 3 is a graph showing a relationship between heat treatment time and pH at 150° C. heat treatment when an initial pH is acidic conditions (pH is less than 7) for the silica fillers surface-treated with different basic substances.

For the untreated sample and the sample surface-treated with ammonia, 3MOPA, pyrrolidine, or DBU, the heat treatment temperature was changed to 150° C., 165° C., and 180° C. in three ways, the heat treatment was performed for 2 hours, and the pH was measured before and after the heat treatment. The results are shown in the following Table 2 and FIG. 2. In the following Table 2 and FIG. 2, for those indicated as unheated in a heat treatment column, the pH values before the heat treatment are shown. The same relationship as above was confirmed also in this case.

TABLE 2

| | | pH | | | |
|---|---|---|---|---|---|
| | | | 2 h Heating | | |
| Silica filler | Basic substance | Unheated | 150° C. | 165° C. | 180° C. |
| SO-E2 | Untreated | 3.7 | — | — | — |
| SO-E2 | Ammonia | 7.5 | 3.8 | 3.8 | 3.7 |
| SO-E2 | 3MOPA | 7.8 | 7.1 | 6.1 | 5.3 |
| SO-E2 | Pyrrolidine | 6.5 | 6.3 | 5.4 | 5.0 |
| SO-E2 | DBU | 7.4 | 7.3 | 7.2 | 7.1 |

For the untreated sample and the sample surface-treated with ammonia, 3MOPA, or pyrrolidine, the pH of the silica filler immediately after the surface treatment was adjusted to be acidic condition (pH is less than 7) in order to eliminate influence of pH difference of the silica filler immediately after the surface treatment, and the heat treatment at 150° C. was performed. The results are shown in the following Table 3. The same relationship as above was confirmed also in this case.

TABLE 3

| | | pH 150° C. Heating | | |
|---|---|---|---|---|
| Silica filler | Basic substance | 0 h | 2 h | 4 h |
| SO-E2 | Unheated | 3.7 | — | — |
| SO-E2 | Ammonia | 4.9 | 3.8 | 3.8 |
| SO-E2 | 3MOPA | 5.3 | 5.4 | 5.3 |
| SO-E2 | Pyrrolidine | 5.2 | 5.1 | 5.1 |

For the sample surface-treated with ammonia, HMDS, benzylamine, 3MOPA, n-butylamine, pyrrolidine, or DBU, and the sample surface-treated with 3MOPA using Sciqas as the silica filler, the surface treatment with the silane coupling agent was further performed in the following procedure.

The silica filler (2000 g) contacted with the basic substance was placed in the mixer, and an isopropanol solution of an epoxy silane coupling agent (Shin-Etsu Chemical Co., Ltd. KBM-403 (3-glycidoxypropyl trimethoxysilane); 20.0 g dissolved in 32.0 g of isopropanol when used) was sprayed while stirring at high speed.

This was transferred to a vat and heated with appropriate stirring to remove isopropanol, to obtain the sample surface-treated with the silane coupling agent.

The obtained sample was heated in the drying machine at 150° C. for 4 hours, and the pH when suspended in water was measured.

Further, an epoxy group residual ratio in the surface of the silica filler before and after the heat treatment was calculated in the procedure shown below.

The number of moles of the epoxy groups present on the surface per 1 g of the silica filler was determined in accordance with JIS-K-7236 "Determination of epoxy equivalent in epoxy resins". The epoxy group residual ratio after the heat treatment was defined as a ratio of amount of the epoxy groups before and after the heat treatment at 150° C. for 4 hours.

The results are shown in the following Table 4

TABLE 4

| Silica filler | Basic substance | Silane coupling agent | | pH After heat treatment (150° C. × 4 h) | Epoxy group amount on surface (μmol/g) | | Epoxy group residual ratio after heat treatment (%) |
|---|---|---|---|---|---|---|---|
| | | Type | Treatment amount (wt %) | | Before heat treatment | After heat treatment (150° C. × 4 h) | |
| SO-E2 | Ammonia | KBM-403 | 1.0 | 3.7 | $3.7 \times 10^{-5}$ | $1.7 \times 10^{-6}$ | 5 |
| SO-E2 | HMDS | KBM-403 | 1.0 | 3.7 | $4.0 \times 10^{-5}$ | $1.3 \times 10^{-6}$ | 3 |
| SO-E2 | Benzyl amine | KBM-403 | 1.0 | 4.3 | $4.2 \times 10^{-5}$ | $1.3 \times 10^{-5}$ | 30 |
| SO-E2 | 3MOPA | KBM-403 | 1.0 | 5.9 | $4.3 \times 10^{-5}$ | $2.2 \times 10^{-5}$ | 51 |
| SO-E2 | n-butyl amine | KBM-403 | 1.0 | 6.8 | $4.1 \times 10^{-5}$ | $1.6 \times 10^{-5}$ | 38 |
| SO-E2 | Pyrrolidine | KBM-403 | 1.0 | 6.6 | $4.3 \times 10^{-5}$ | $1.7 \times 10^{-5}$ | 39 |
| SO-E2 | DBU | KBM-403 | 1.0 | 7.9 | $4.1 \times 10^{-5}$ | $2.2 \times 10^{-5}$ | 53 |
| Sciqas | 3M0PA | KBM-403 | 3.0 | 6.6 | $1.2 \times 10^{-4}$ | $8.9 \times 10^{-5}$ | 74 |

In the sample surface-treated with ammonia or HMDS having the pKa of less than 9.4, the pH of the silica filler after the heat treatment at 150° C. for 4 hours was low, and the epoxy group residual ratio after the heat treatment was also low.

On the other hand, in the sample contacted with benzylamine, 3MOPA, n-butylamine, pyrrolidine, or DBU having the pKa of 9.4 or more, and the sample contacted with 3MOPA using Sciqas as the silica filler, the pH of the silica filler after the heat treatment at 150° C. for 4 hours was high, and the epoxy group residual ratio after the heat treatment was also high.

(Non-Silane Coupling Agent Surface Treatment Filler Blended System (Integral Blend Method))

For the silica filler surface-treated with ammonia, HMDS, 3MOPA, or DBU, the resin composition was prepared in which a sample heated at 150° C. for 4 hours as pre-drying was blended, and the silane coupling agent was separately added (integral blend method).
A blending ratio of each component is as shown below.
Epoxy resin: 35.3 wt %
(Bisphenol F type epoxy resin, product name YDF-8170, Nippon Steel & Sumikin Chemical Co., Ltd.)
Curing agent: 14.2 wt %
(Amine-based curing agent, product name KAYAHARD A-A, Nippon Kayaku Co., Ltd.)
Non-silane coupling agent surface-treated silica filler: 50.0 wt %
Silane coupling agent: 0.5 wt %
(Product name KBM-403, Shin-Etsu Chemical Co., Ltd.)
Total: 100.0 wt. %

The components were mixed and dispersed by a hybrid mixer, and vacuum degassed to prepare the resin composition for evaluation.

Further, also for an untreated silica filler which was not surface-treated with the basic substance, the resin composition was prepared by the above-described procedure.

Furthermore, for the untreated silica filler which was not surface-treated with the basic substance, and the sample which was surface-treated with 3MOPA, the resin composition was prepared in which a methacrylic silane coupling agent (product name KBM-503 (3-methacryloxypropyltrimethoxysilane), Shin-Etsu Chemical Co., Ltd.) was blended in place of KBM-403 as the silane coupling agent.
(Silane Coupling Agent Surface Treatment Filler Blended System)

For the silica filler surface-treated with ammonia, HMDS, 3MOPA or DBU, it was surface-treated with the silane coupling agent by the above-described procedure, and the resin composition was prepared in which the sample heated at 150° C. for 4 hours as pre-drying was blended.
The blending ratio of each component is as shown below.
Epoxy resin: 35.3 wt %
(Bisphenol F type epoxy resin, product name YDF-8170, Nippon Steel & Sumikin Chemical Co., Ltd.)
Curing agent: 14.2 wt %
(Amine-based curing agent, product name KAYAHARD A-A, Nippon Kayaku Co., Ltd.)
Silane coupling agent surface-treated silica filler: 50.5 wt %
Total: 100.0 wt %

The components were mixed and dispersed by the hybrid mixer, and vacuum degassed to prepare the resin composition for evaluation.

Further, also for the untreated silica filler which was not surface-treated with the basic substance, it was surface-treated with the silane coupling agent by the above-described procedure, and the resin composition was prepared in which the silica filler heated at 150° C. for 4 hours as pre-drying is blended.

Furthermore, for the untreated silica filler which was not surface-treated with the basic substance, and the sample surface-treated with 3MOPA, the resin composition was prepared in which the methacrylic silane coupling agent (product name KBM-503 (3-methacryloxypropyltrimethoxysilane), Shin-Etsu Chemical Co., Ltd.) was blended in place of KBM-403 as the silane coupling agent.

The evaluation shown below was performed using the obtained resin compositions for evaluation. The results are shown in the following Table 5.

Note that the pH in Table 5 shows a value of the pH when each silica filler used for preparing the resin composition is suspended in water.
(Resin Composition Viscosity)

The viscosity was measured with a rotational viscometer (Brookfield viscometer DV-1) at a liquid temperature of 25° C. while rotating a spindle at 50 rpm.

TABLE 5

| Silica filler | Basic substance | Silane coupling agent | Non-silane coupling agent surface treatment filler blended (Integral blend method) | | Silane coupling agent surface treatment filler blended | |
|---|---|---|---|---|---|---|
| | | | pH | Resin composition viscosity (Pa · s) | pH | Resin composition viscosity (Pa · s) |
| SO-E2 | Untreated | KBM-403 | 3.9 | 36.4 | 3.6 | Unmeasurable[1] |
| SO-E2 | Ammonia | KBM-403 | 3.7 | 26.8 | 3.6 | 115.0 |
| SO-E2 | HMDS | KBM-403 | 4.0 | 30.8 | 3.7 | 66.6 |
| SO-E2 | 3MOPA | KBM-403 | 6.8 | 13.2 | 6.5 | 15.8 |
| SO-E2 | DBU | KBM-403 | 7.5 | 16.4 | 7.7 | 16.2 |
| SO-E2 | Untreated | KBM-503 | 3.9 | 38.0 | 4.0 | Unmeasurable[1] |
| SO-E2 | 3MOPA | KBM-503 | 6.8 | 14.0 | 5.2 | 37.2 |

[1]Unmeasurable because the viscosity of the resin composition was extremely high and exceeded an upper limit of the viscometer In both the resin compositions of the resin composition in which the non-silane coupling agent surface-treated filler was blended and the silane coupling agent was separately added (integral blending method), and the resin composition in which the silane coupling agent surface-treated filler was blended, the viscosity of the sample surface-treated with ammonia or HMDS having the pKa of less than 9.4 was high as in the resin composition in which the untreated silica filler which was not surface-treated with the basic substance was blended. In contrast, in the sample surface-treated with 3MOPA or DBU having the pKa of 9.4 or more, the viscosity of the resin composition was significantly reduced as compared to that of the resin composition in which the untreated silica filler which was not surface-treated with the basic substance was blended. The same applies to the sample surface-treated with the methacrylic silane coupling agent (KBM-503).

The invention claimed is:

1. A surface-treated silica filler, wherein a basic substance having an acid dissociation constant (pKa) of its conjugate acid of 9.4 or more is chemisorbed to an acidic silanol group present on the surface of the silica filler by surface treatment with the basic substance having the pKa of 9.4 or more, and
wherein the surface-treated silica filler has a pH of 5.3 to 7.3 after heat treatment at 150° C. for 4 hours.

2. The surface-treated silica filler according to claim 1, wherein the basic substance having the pKa of 9.4 or more is selected from the group consisting of benzylamine, 2-methoxyethylamine, 3-amino-1-propanol, 3-aminopentane, 3-methoxypropylamine, cyclohexylamine, n-butylamine, dimethylamine, diisopropylamine, piperidine, pyrrolidine, and 1,8-diazabicyclo [5.4.0]-7-undecene (DBU), and combinations thereof.

3. The surface-treated silica filler according to claim 1, wherein the silica filler is selected from the group consisting of spherical silica powder obtained by reacting metal silicon with oxygen, spherical silica powder obtained by melting pulverized silica, and pulverized silica.

4. The surface-treated silica filler according to claim 1, wherein the silica filler is obtained by a method selected from the group consisting of sol-gel method, precipitation method, and aqueous solution wet method.

5. The surface-treated silica filler according to claim 1, which is surface-treated with the basic substance having the pKa of 9.4 or more, and then further surface-treated with a silane coupling agent.

6. The surface-treated silica filler according to claim 5, wherein the silane coupling agent is selected from the group consisting of an epoxy silane coupling agent, an amine-based silane coupling agent, a vinyl silane coupling agent, and an acrylic silane coupling agent.

7. A resin composition comprising the surface-treated silica filler according to claim 1.

8. A semiconductor sealing material comprising the resin composition according to claim 7.

9. A one-component adhesive comprising the resin composition according to claim 7.

10. An adhesive film comprising the resin composition according to claim 7.

11. The surface-treated silica filler according to claim 1, wherein the basic substance having the pKa of 9.4 or more is selected from the group consisting of benzylamine, 3-methoxypropylamine, pyrrolidine, and combinations thereof.

12. The surface-treated silica filler according to claim 1, wherein a sphericity of a silica filler to be surface-treated is 0.8 or more.

13. The surface-treated silica filler according to claim 1, wherein the surface-treated silica filler is mixed to form a resin after pre-drying.

14. The surface-treated silica filler according to claim 2, which is surface-treated with the basic substance having the pKa of 9.4 or more, and then further surface-treated with a silane coupling agent.

15. The surface-treated silica filler according to claim 2, wherein the surface-treated silica filler is mixed to form a resin after pre-drying.

16. The surface-treated silica filler according to claim 5, wherein the basic substance having the pKa of 9.4 or more is selected from the group consisting of benzylamine, 3-methoxypropylamine, pyrrolidine, and combinations thereof.

17. The surface-treated silica filler according to claim 5, wherein the surface-treated silica filler is mixed to form a resin after pre-drying.

* * * * *